United States Patent [19]
Ong et al.

[11] Patent Number: 5,488,583
[45] Date of Patent: Jan. 30, 1996

[54] MEMORY INTEGRATED CIRCUITS HAVING ON-CHIP TOPOLOGY LOGIC DRIVER, AND METHODS FOR TESTING AND PRODUCING SUCH MEMORY INTEGRATED CIRCUITS

[75] Inventors: Adrian E. Ong; William K. Waller; Paul S. Zagar, all of Boise, Id.

[73] Assignee: Micron Technology, Inc., Boise, Id.

[21] Appl. No.: 311,582

[22] Filed: Sep. 22, 1994

[51] Int. Cl.[6] .............................. G11C 7/00; G11C 29/00
[52] U.S. Cl. ...................... 365/201; 371/21.2; 364/491
[58] Field of Search .................................. 365/200, 201, 365/206, 69; 371/21.2, 21.3; 364/490, 491

[56] References Cited

U.S. PATENT DOCUMENTS 5,208,778  5/1993  Kumanoya et al. .................. 365/201
5,263,029  11/1993  Wicklund, Jr. ........................ 365/201

OTHER PUBLICATIONS

Kwon, Oh–Hyun et al., "A Review on Critical Technology for a Manufacturable 64Mb DRAM", Samsung Electronics Co., pp. 41.46. (Publication Date Unavailable).

Yoshihara, Tsutomu et al., "A Twisted Bit Line Technique for Multi–Mb DRAMs", IEEE International Solid–State Circuits Conf., 1988 pp. 238–239.

*Primary Examiner*—Joseph A. Popek
*Attorney, Agent, or Firm*—Wells, St. John, Roberts, Gregory & Matkin

[57] ABSTRACT

A memory integrated circuit chip of a predefined circuit topology has an on-chip topology logic driver. The topology logic driver selectively inverts data being written to and read from addressed memory cells in the memory IC based upon location of the addressed memory cells in the circuit topology of the memory array. The topology logic driver is preferably a logic circuit that embodies a boolean function defining the circuit topology. A method for testing and producing such memory ICs is also described.

16 Claims, 8 Drawing Sheets

TWIST

| | | RA8=0 | | | | RA8=1 | | |
|---|---|---|---|---|---|---|---|---|
| RA0 | 0 | 1 | 0 | 1 | 0 | 1 | 0 | 1 |
| RA1 | 0 | 0 | 1 | 1 | 0 | 0 | 1 | 1 |
| | R512 | R513 | R514 | R515 | R768 | R769 | R770 | R771 |
| CA2=0 | D1 1 | D0 1 | D0 1 | D1 1 | D0 0 | D1 1 | D1 1 | D0 0 |
| | D0 0 | D1 0 | D1 0 | D0 0 | D1 0 | D0 1 | D0 1 | D1 0 |
| | D3 1 | D2 1 | D2 1 | D3 1 | D2 0 | D3 1 | D3 1 | D2 0 |
| | D2 0 | D3 0 | D3 0 | D2 0 | D3 0 | D2 1 | D2 1 | D3 0 |
| CA2=1 | D3 0 | D2 0 | D2 0 | D3 0 | D2 1 | D3 0 | D3 0 | D2 1 |
| | D2 1 | D3 1 | D3 1 | D2 1 | D3 1 | D2 0 | D2 0 | D3 1 |
| | D1 0 | D0 0 | D0 0 | D1 0 | D0 1 | D1 0 | D1 0 | D0 1 |
| | D0 1 | D1 1 | D1 1 | D0 1 | D1 1 | D0 0 | D0 0 | D1 1 |

FIG. 5

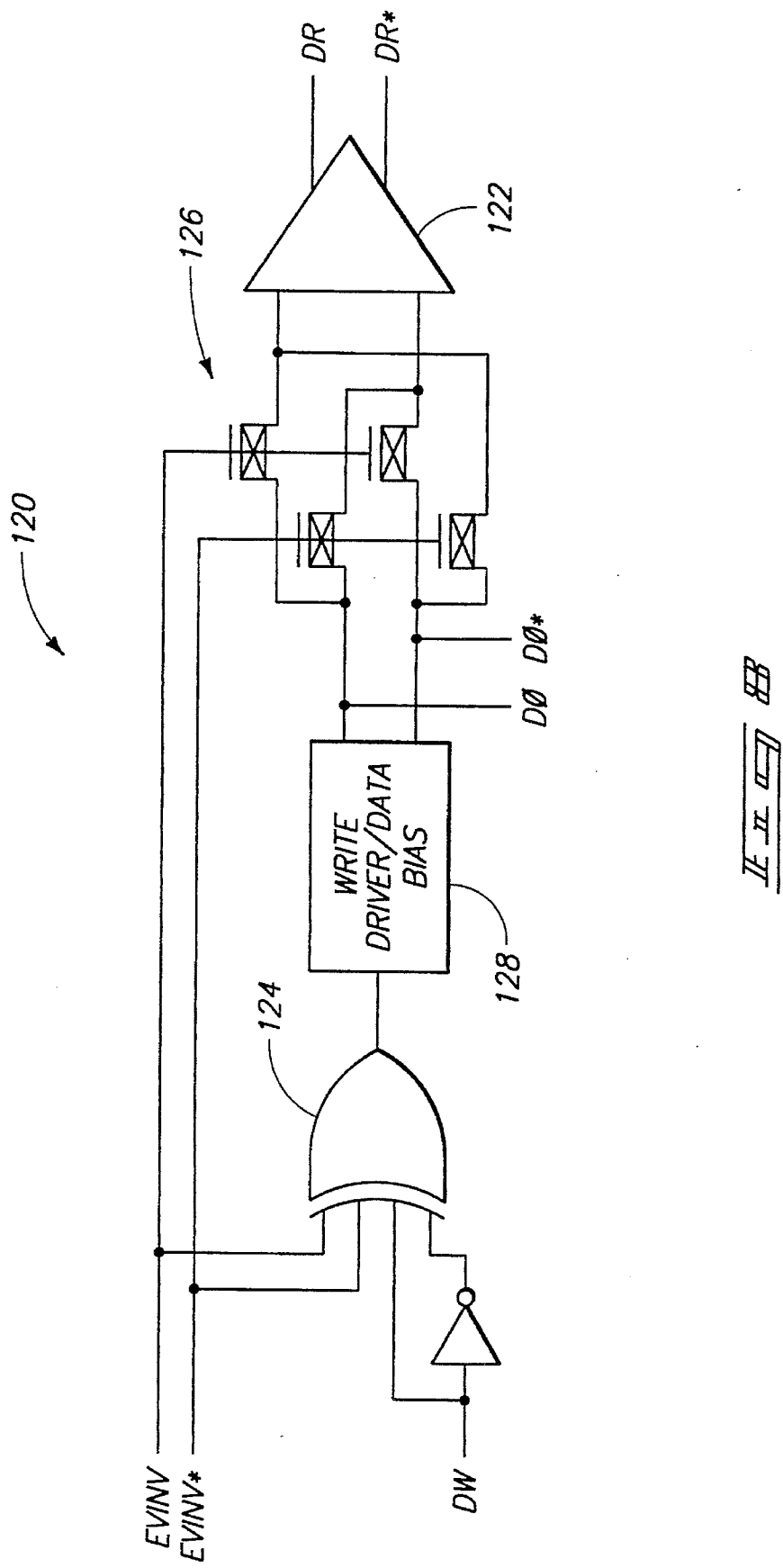

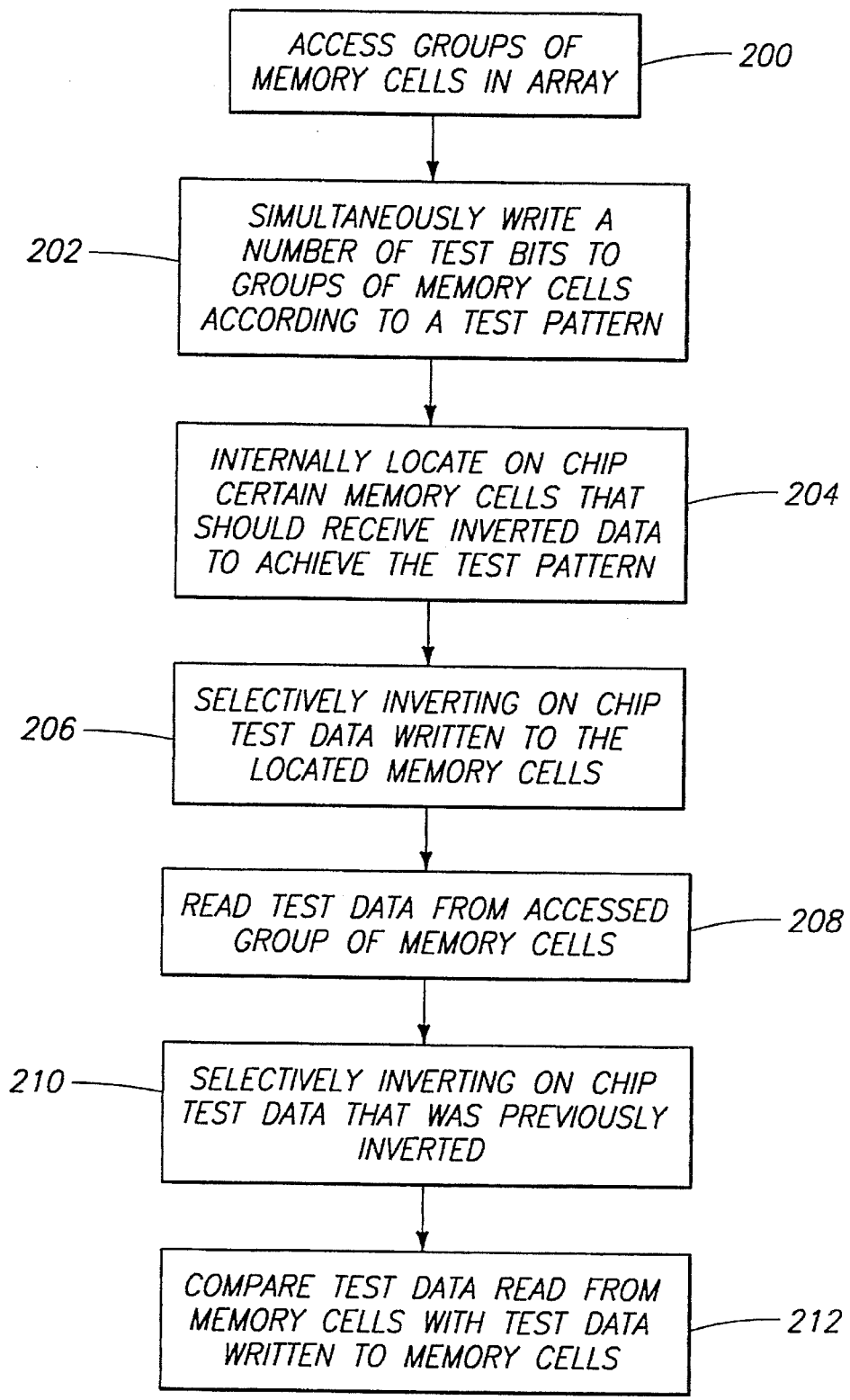

MEMORY INTEGRATED CIRCUITS HAVING ON-CHIP TOPOLOGY LOGIC DRIVER, AND METHODS FOR TESTING AND PRODUCING SUCH MEMORY INTEGRATED CIRCUITS

TECHNICAL FIELD

This invention relates to memory integrated circuits having on-chip topology decoding circuits. The invention also relates to methods for testing and producing such circuits.

BACKGROUND OF THE INVENTION

Memory integrated circuits (ICs) have a memory array of millions of memory cells used to store electrical charges indicative of binary data. For instance, the presence of an electrical charge in the memory cell typically equates to a binary "1" value and the absence of an electrical charge typically equates to a binary "0" value. The memory cells are accessed via address signals on row and column lines. Once accessed, data is written to or read from the addressed memory cell via digit or bit lines.

The memory cells, row lines, and column lines within the memory array are arranged in a particular layout or configuration that is commonly referred to as the circuit "topology." Circuit topologies vary considerably among variously designed memory ICs.

One common design found in many memory circuit topologies is the "folded bit line" structure. In a folded bit line construction, the bit lines are arranged in pairs with each pair being assigned to complementary binary signals. For example, one bit line in the pair is dedicated to a binary signal DATA and the other bit line is dedicated to handle the complementary binary signal DATA*. (The asterisk notation "*" is used throughout the disclosure to indicate the binary complement.)

The memory cells are connected to either of the bit lines in the folded pair. During read and write operations, the bit lines are driven to opposing voltage levels depending upon the data content being written to or read from the memory cell. For purposes of explanation, the following example describes a read operation of a memory cell holding a charge indicative of a binary "1". The voltage potential of both bit lines in the pair are first equalized to a middle voltage level, such as 2.5 volts. Then, the addressed memory cell is accessed and the charge held therein is transferred to one of the bit lines, raising the voltage of that bit line slightly above the pair counterpart. A sense amplifier, or similar circuit, senses the voltage differential on the bit line pair and further increases this differential by increasing the voltage on the first bit line to, say, 5 volts and decreasing the voltage on the second bit line to, say, 0 volts. The folded bit lines thereby output the data in complementary form.

One version of a folded bit line structure is the twisted bit line structure. FIG. 1 illustrates a twisted bit line structure having bit line pairs D0/D0*-D3/D3* that flip or twist at junctions 20 across the array. Memory cells are coupled to the bit line pairs throughout the array. Representative memory cells 22a–22n and 24a–24n are shown coupled to bit line pair D0/D0*. The twisted bit line structure evolved as a technique to reduce bit-line interference noise during chip operation. Such noise is increasingly more problematic as memory sizes increase. The twisted bit line structure is therefore used in larger memories, such as a 64 Meg DRAM (Dynamic Random Access Memory).

The twisted bit line structure presents a more complex topology than the simple folded bit line construction. Addressing memory cells in the FIG. 1 layout is more involved. For instance, different addresses are used for the memory cells on either side of a twist junction 20. As memory ICs increase in memory capacity, yet maintain or decrease in size, other noise problems and layout constraints force the designer to conceive of more intricate configurations. As a result, the topologies of these circuits become more and more complex, and are more difficult to describe mathematically as each layer of complexity adds additional terms to a topology-describing equation. This in turn may give rise to more complex addressing schemes.

One problem that arises for memory ICs involves testing procedures. It is increasingly more difficult to test memory ICs that have intricate topologies. To test ICs, the memory manufacturer employs a testing machine that is preprogrammed by the manufacturer with a complex boolean function that describes the topology of the memory IC. This boolean function is derived by the manufacturer. Conventional testing machines are capable of handling up to 6-bit addresses. As topologies grow more complex, however, the 6-bit addresses are incapable of fully addressing all individual cells for some test patterns. This renders the testing apparatus ineffective. Furthermore, if a user wishes to trouble shoot a particular memory device after some period of use, it is very difficult to derive the necessary boolean function for input to the testing machine without consulting the manufacturer.

The testing problem becomes more manifest when a form of compression is used during testing to accelerate the testing period. It is common to write test patterns of all "1"s or all "0"s to a group of memory cells simultaneously. Consider the following example test pattern of writing all "1"s to the memory cells in the twisted bit line pairs of FIG. 1. Under the testing compression, one bit is used to address all four bit line pairs D0/D0*, D1/D1*, D2/D2*, and D3/D3*. Under this conventional addressing scheme, the task of placing "1"s in all memory cells is impossible because it cannot be discerned from a single address bit whether the memory cell, in order to receive a "1", needs to have a binary "1" or "0" placed on the bit line connected to the memory cell. Accordingly, the testing machines may not adequately test memory ICs of complex topologies. Conversely, it is less desirable to test memory ICs on a per cell basis as the testing period is too long.

It is therefore an object of this invention to provide a memory IC that facilitates such testing, as well as methods for testing semiconductor memory ICs having complex circuit topologies.

BRIEF DESCRIPTION OF THE DRAWINGS

Preferred embodiments of the invention are described below with reference to the following accompanying drawings. The same numbers are used throughout the disclosure to reference like components and features.

FIG. 4 also illustrates a preferred twisted bit line structure.

FIG. 5 is a table representing the circuit topology of the FIG. 4 array block.

FIG. 8 is a schematic of a data inversion I/O circuit in the topology logic driver of FIG. 2.

FIG. 9 is a flow diagram illustrating a method for testing a memory integrated circuit having an on-chip topology logic driver according to this invention.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

This invention provides a semiconductor memory IC having a built-in, on-chip topology circuit. The memory IC includes a memory array of a predefined circuit topology having a plurality of memory cells and multiple access lines coupled to associated memory cells. Some of the access lines are arranged in pairs. An address decoder provides an address for selectively accessing one or more memory cells in the memory array and I/O buffers temporarily hold data written to and read from the memory cells. A read/write controller manages the data write and data read operations which transfer data between the I/O buffers and the addressed memory cells.

The on-chip topology logic driver selectively inverts the data being written to and read from the addressed memory cells. The topology logic driver selectively inverts the data for certain addressed memory cells and does not invert the data for other addressed memory cells based upon location of the addressed memory cells in the circuit topology of the memory array. According to a preferred construction, the topology logic driver includes a combination of logic gates that embody a boolean function of selected bits in the address, whereby the boolean function defines the circuit topology of the memory array.

Figure 1:
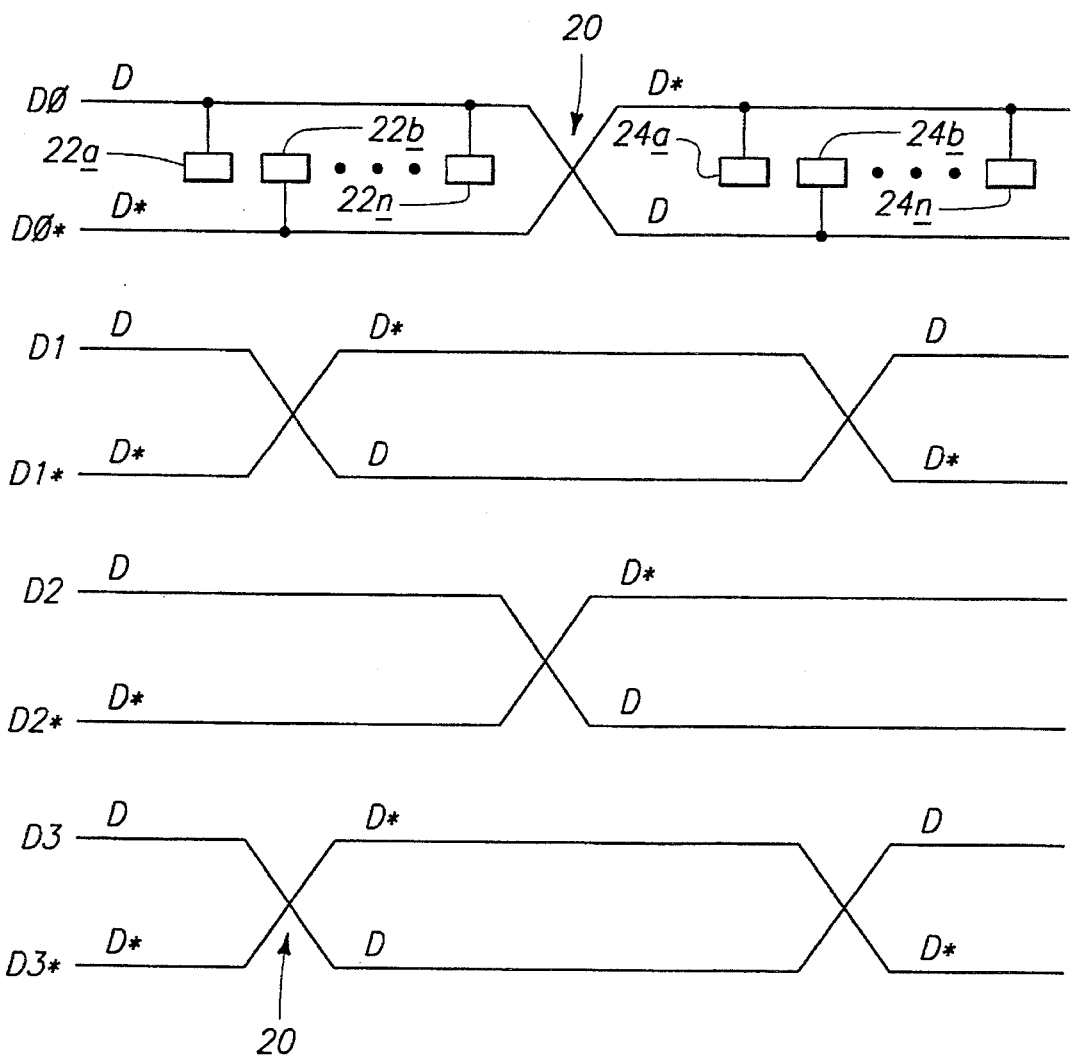
FIG. 1 is a diagrammatic circuit topology having a folded and twisted bit line structure.
Figure 2:
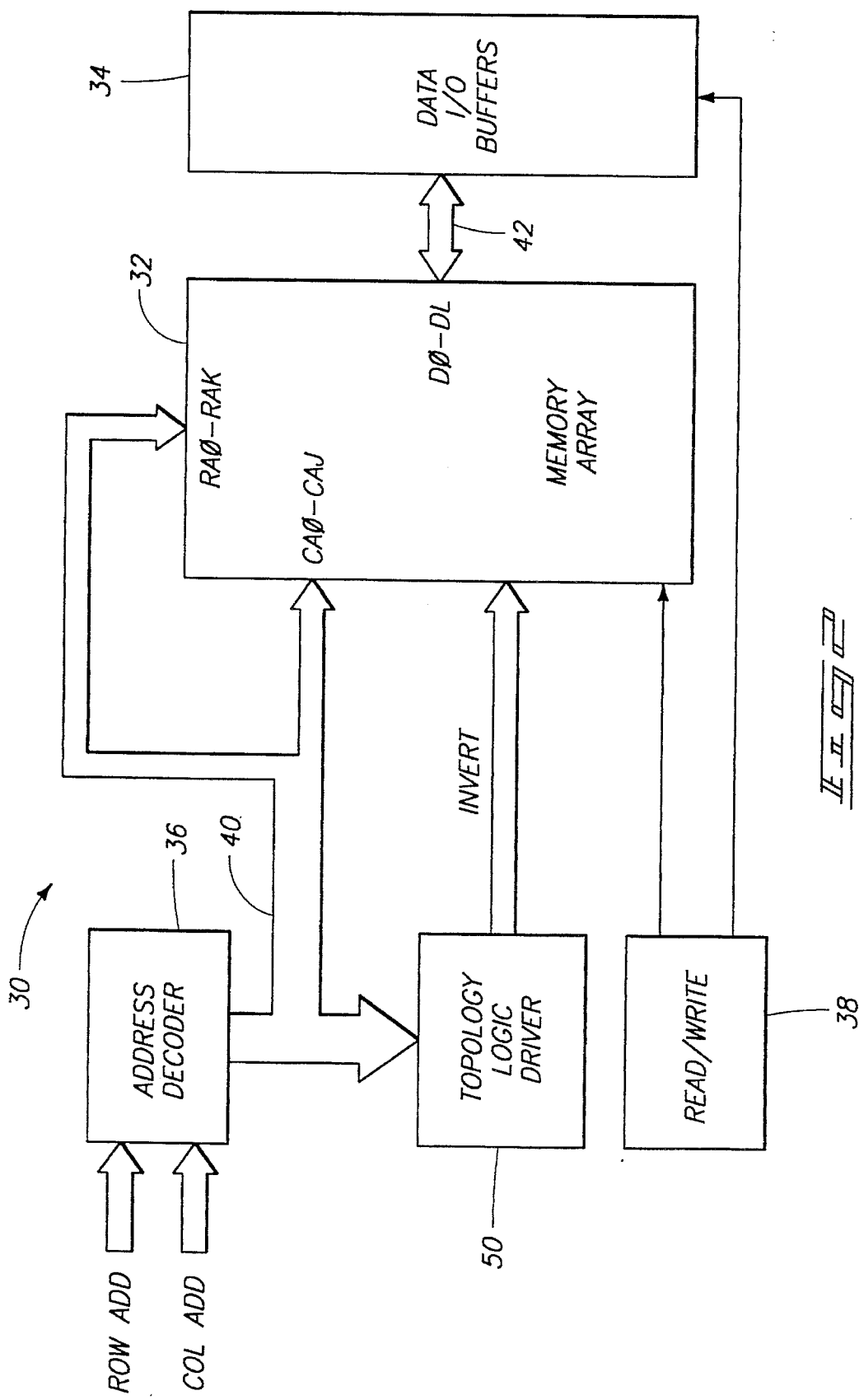
FIG. 2 is a block diagram of a memory integrated circuit constructed according to this invention. The memory integrated circuit includes a memory array and a topology logic driver.

FIG. 2 shows a semiconductor memory IC chip 30 constructed according to this invention. Memory IC 30 includes a memory array 32, data I/O buffers 34, an address decoder 36, and a read/write controller 38. Memory array 32 is comprised of many memory cells arranged in a predefined circuit topology. The memory cells are addressable via column address signals CA0-CAJ and row address signals RA0-RAK. Address decoder 36 receives row addresses and column address from an external source (such as a microprocessor or computer) and further decodes the addresses for internal use on the chip. The internal row and column addresses are carried via address bus 40. The address decoder 36 thus provides an address (consisting of the row and column addresses) for selectively accessing one or more memory cells in the memory array.

Data I/O buffers 34 temporarily hold data written to and read from the memory cells in the memory array. The data I/O buffers, which are sometimes referred to as DQ buffers, are coupled to memory array 32 via data bus 42 that carries data D0-DL. Read/write controller 38 is coupled to memory array 32 and data I/0 buffers 34 to generate timing and control signals used to manage data write and data read operations which transfer data between the I/O buffers and the memory cells. In this manner, the data I/O buffers and the read/write controller 38 effectively form a data I/O means for reading and writing data to chosen bit lines.

Memory IC 30 also has an on-chip topology logic driver 50 coupled to address bus 40 and to the memory array 32. Topology logic driver outputs one or more invert signals which selectively invert the data being written to and read from the memory cells over I/O data bus 42 to account for complexities in the circuit topology of the IC. The topology logic driver selectively inverts the data for certain memory cells and does not invert the data for other memory cells based upon location of the memory cells in the circuit topology of the memory array.

In the illustrated example, as will be discussed throughout this disclosure for purposes of explaining the various aspects of this invention, topology logic driver 50 outputs invert signals in the form of two sets of complementary signals EVINV/EVINV* and ODINV/DDINV*. The complementary EVINV/EVINV* signals are used to alternately invert or not invert the even bits of data being transferred to and from the memory array over data bus 42. Likewise, the complementary ODINV/ODINV* signals are used to alternately invert or not invert the odd bits of data. These complementary signals are described below in more detail.

The topology logic driver 50 is uniquely designed for different memory IC layouts. It is configured specially to account for the specific topology design of the memory IC. Accordingly, the topology logic driver 50 will be structurally different for various memory ICs. The logic driver is preferably embodied as logic circuitry that expresses the boolean function that defines the circuit topology of the given memory array. By designing the topology logic driver onto the memory IC chip, there is no need to specially program the testing machines used to test the memory ICs with complex boolean functions for every test batch of a different memory IC. The memory IC will now automatically realize the topology adjustments without any external consideration by the manufacturer or subsequent user.

For purposes of continuing discussion, the invention will be described in the context of a 64 Meg DRAM. One preferred construction of the topology logic driver 50 will therefore be explained in detail.

Figure 3:
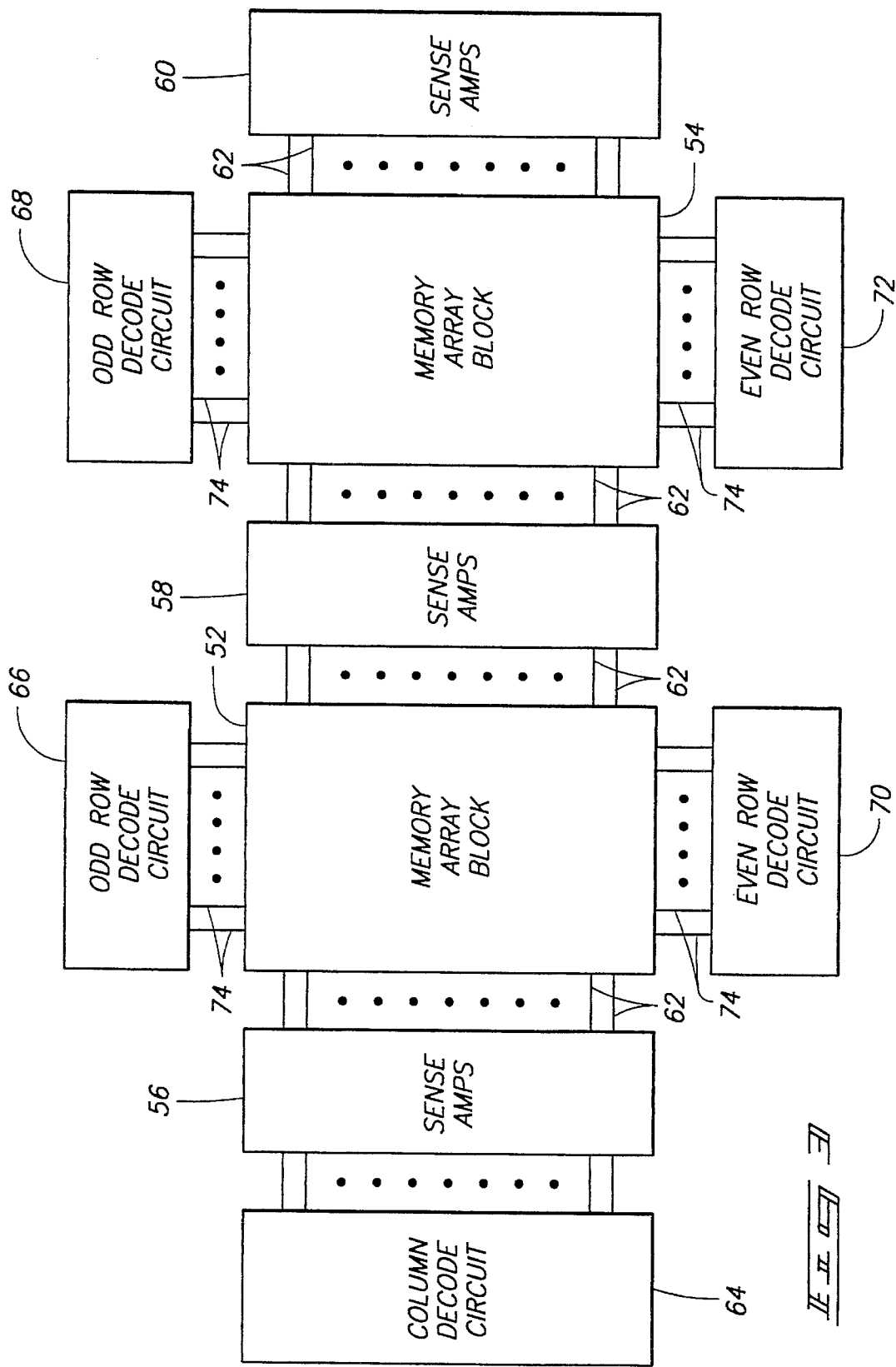
FIG. 3 is a block diagram illustrating two memory array blocks in the memory array of the FIG. 2.

FIG. 3 shows a portion of the memory array 32 of FIG. 2. The memory portion has a first memory block 52 and a second memory block 54. Each memory block has multiple arrayed memory cells connected at intersections of row access lines and column access lines. The first memory block 52 is coupled between two sets of low voltage, N and P sense amplifiers 56 and 58. Similarly, second memory block 54 is coupled between two sets of N and P sense amplifiers 56 and 60. The sense amplifiers are connected to column access lines 62, which are also commonly referred to as bit or digit lines. The column access lines 62 are selected by column decode circuit 64 which regionally decodes the column address received from address decoder 36 (FIG. 2).

Each memory block 52 and 54 is also coupled to an odd row decode circuit 66 and 68 and an even row decode circuit 70 and 72, respectively. These decode circuits are connected to row access lines 74, which are also commonly referred to as word lines. The row decode circuits select the row lines 74 for access to memory cells in the memory array blocks based upon the row address received from address decoder 36.

Figure 4:
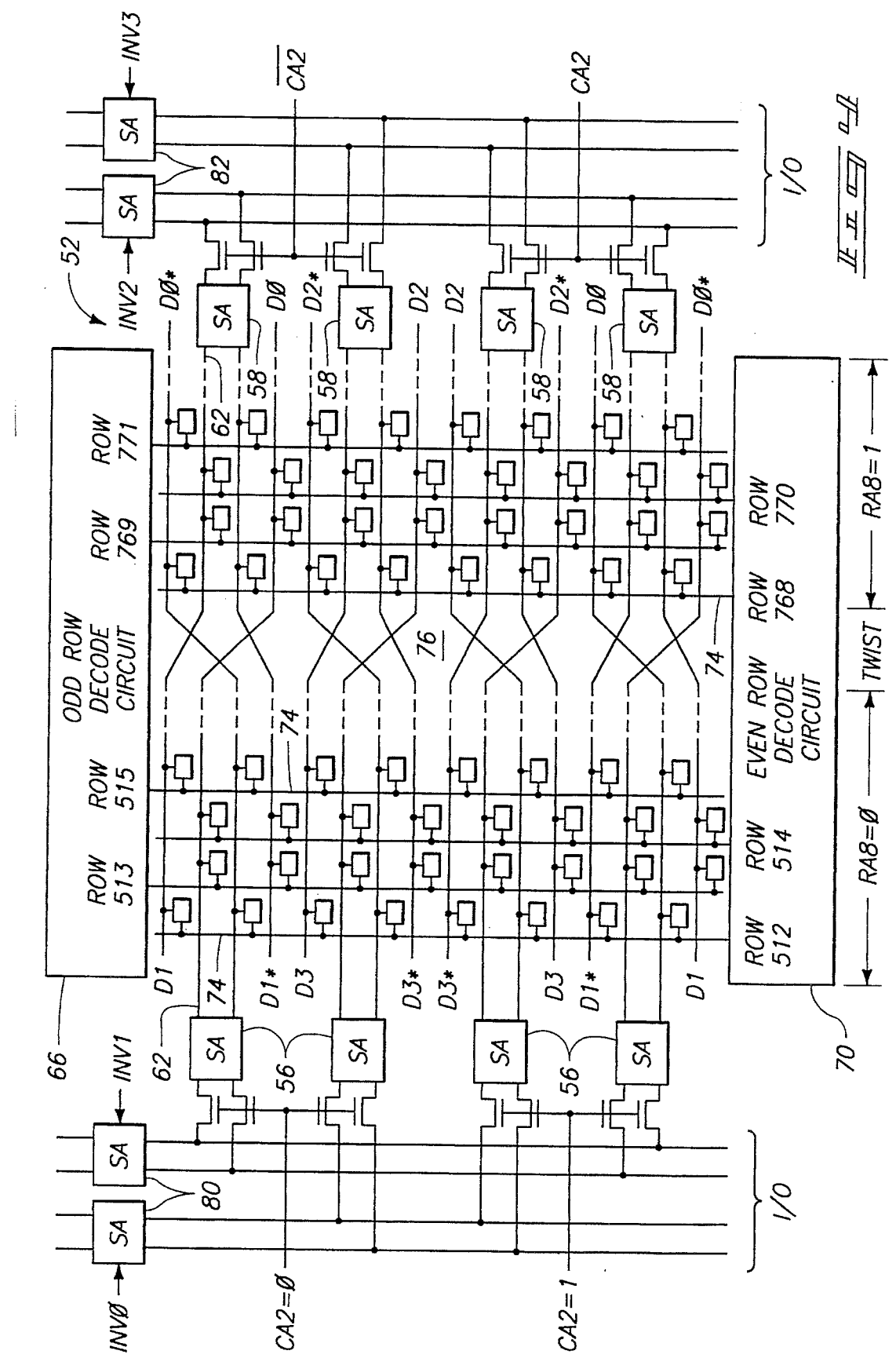
FIG. 4 is a block diagram of one preferred circuit topology of a memory array block in FIG. 3 according to one embodiment of this invention.

FIG. 4 shows memory array block 52 in more detail. The memory array block has a plurality of memory cells (designated by the small boxes) operatively connected at intersections of the row access lines 74 and column access lines 62. Column access lines are arranged in pairs to form bit line pairs. Two sets of four bit line pairs are illustrated where each set includes bit line pairs D0/D0*, D1/D1*, D2/D2*, and D3/D3*. The upper or first set of bit line pairs is selected by column address bit CA2=0 and the lower or second set of bit line pairs is selected by column address bit CA2=1.

The even bit line pairs D0/D0* and D2/D2* are coupled to left or even primary sense amplifiers 56. The odd bit line pairs D1/D1* and D3/D3* are coupled to right or odd primary sense amplifiers 58. The even or odd sense amplifiers are alternatively selected by the least significant bit of the column address CA0, where CA0=0 selects the even primary sense amplifiers 56 and CA0=1 selects the odd primary sense amplifiers 58. The four even bit line pairs D0/D0* and D2/D2* are further coupled to two sets of I/O lines that proceed to secondary DC sense amplifiers 80. Likewise, the four odd bit line pairs D1/D1* and D3/D3* are coupled to a different two sets of I/O lines which are connected to secondary DC sense amplifiers 82. The secondary DC sense amplifiers 80 and 82 are coupled via the same data line to a data I/O buffer (not shown in this FIG. 4).

The DC sense amplifiers 80 have incoming invert signals INV0 and INV1, whereas DC sense amplifiers 82 are coupled to receive invert signals INV2 and INV3. These signals are generated in topology logic driver 50 (FIG. 2). These independent invert signals can separately invert the data on bit lines D0/D0*, D1/D1*, D2/D2*, and D3/D3*. In other embodiments, less than four separate invert signals can be used. In the illustrated circuit topology, which is described below in more detail with respect to FIG. 5, it turns out that the even data bits placed on even bit lines D0 and D2 are identical throughout the array and the odd data bits placed on odd bit lines D1 and D3 are identical. Thus, two invert signals, even invert EVINV and odd invert ODINV, can be used in place of the four depicted invert signals INV0-INV3.

Individual bit line pairs have a twisted line structure where bit lines in the bit line pairs cross other bit lines in the bit line pairs at twist junctions 76 in the middle of the memory array block. The preferred construction employs a twist configuration involving overlapping of bit lines from two bit line pairs.

Row lines 74 are used to access individual memory cells coupled to the selected rows. The even rows 512, 514, . . . , 768, 770, . . . etc. are coupled to even row decode circuit 70, whereas the odd rows 513, 515, . . . , 769, 771, . . . , etc. are coupled to odd row decode circuit 66. The memory cells to the left of the twist junctions 76 are addressed via row address bit RA8-0 and the memory cells to the right of the twist junctions 76 are addressed via row address bit RA8=1.

The IC layout of FIG. 4 presents a specific example of a circuit topology of a 64 Meg DRAM. Given this circuit topology, a topology logic driver 50 can be derived for this DRAM. The unique derivation for the DRAM will now be described in detail with reference to FIGS. 5–8.

FIG. 5 shows a table representing the circuit topology of the array block 52. The table contains example rows R512, R513, R514, and R515 to the left of the twist and example rows R768, R769, R770, and R771 to the right of the twist. The table is generated by examining the circuit topology in terms of memory cell location and assuming that the binary value "1" is written to all memory cells in the array block 52.

Consider the memory cells coupled to row R512. This row is addressed by RA8=0, RA1=0, and RA0=0. The upper set of bit line pairs is addressed via CA2=0. For the bit line pair D1/D1*, the memory cell on row R512 in the array block 52 (FIG. 4) is coupled to bit line D1. Thus, the table reflects that a binary "1" should be written to bit line D1 to place a data value of "1" in the memory cell. For bit line pair D0/D0*, the memory cell on row R512 is coupled to bit line D0*. The table therefore reflects that a binary "0" should be written to bit line D0 (i.e., this is the same as writing a binary "1" to complementary bit line D0*) to place a data value of "1" in the memory cell. The table is completed in this manner.

Notice that some of the data bits entered in the table are binary "0"s even though the test pattern is all "1"s. This result is due to the given circuit topology which requires the input of a binary "0", or complementary inverse of binary "1", to effectuate storage of a binary "1" in the desired cell.

For this circuit topology, the even data bits placed on the even bit lines D0 and D2 are identical throughout the array. Similarly, the odd data bits placed on the odd bit lines D1 and D3 are identical. Accordingly, two pair of complementary signals can be used to selectively invert the even and odd bits of data for input to the memory cells. These complementary inversion signals are EVINV/EVINV* and ODINV/ODINV* as shown in FIG. 2, where EVINV/EVINV* are used to invert the even bits and ODINV/ODINV* are used to invert the odd bits.

A boolean function for the inversion signals EVINV and ODINV for the example circuit topology of FIG. 4 can be derived from the FIG. 5 table as follows:

$$\begin{aligned}
EVINV &= [(RA8^* \times RA0^* \times RA1^*) + (RA8^* \times RA0 \times RA1) + (RA8 \times RA0^* \times RA1^*) + \\
&\quad (RA8 \times RA0 \times RA1)] \times CA2^* + [(RA8^* \times RA0 \times RA1^*) + (RA8^* \times RA0^* \times RA1) + \\
&\quad (RA8 \times RA0 \times RA1^*) + (RA8 \times RA0^* \times RA1)] \times CA2 \\
&= (RA0^* \times RA1^* + RA0 \times RA1) \times CA2^* + (RA0 \times RA1^* + RA0^* \times RA1) \times CA2 \\
ODINV &= [(RA8^* \times RA0 \times RA1^*) + (RA8^* \times RA0^* \times RA1) + (RA8 \times RA0^* \times RA1^*) + \\
&\quad (RA8 \times RA0 \times RA1)] \times CA2^* + [(RA8^* \times RA0^* \times RA1^*) + (RA8^* \times RA0 \times RA1) + \\
&\quad (RA8 \times RA0 \times RA1^*) + (RA8 \times RA0^* \times RA1)] \times CA2 \\
&= [RA8^* \times (RA0 \oplus RA1) + RA8 \times (RA0 \oplus RA1)^*] \times CA2^* + \\
&\quad [RA8^* \times (RA0 \oplus RA1)^* + RA8 \times (RA0 \oplus RA1)] \times CA2
\end{aligned}$$

Some of the memory cells in the array block are redundant memory cells. For example, the memory cells coupled to rows 512 and 768 might be redundant memory cells. Such cells are used to replace defective memory cells in the array that are detected during testing. One preferred method for testing the memory IC having on-chip topology logic driver is described below. The process of substituting redundant memory cells for defective memory cells can be accomplished using conventional, well known techniques.

Figure 6:
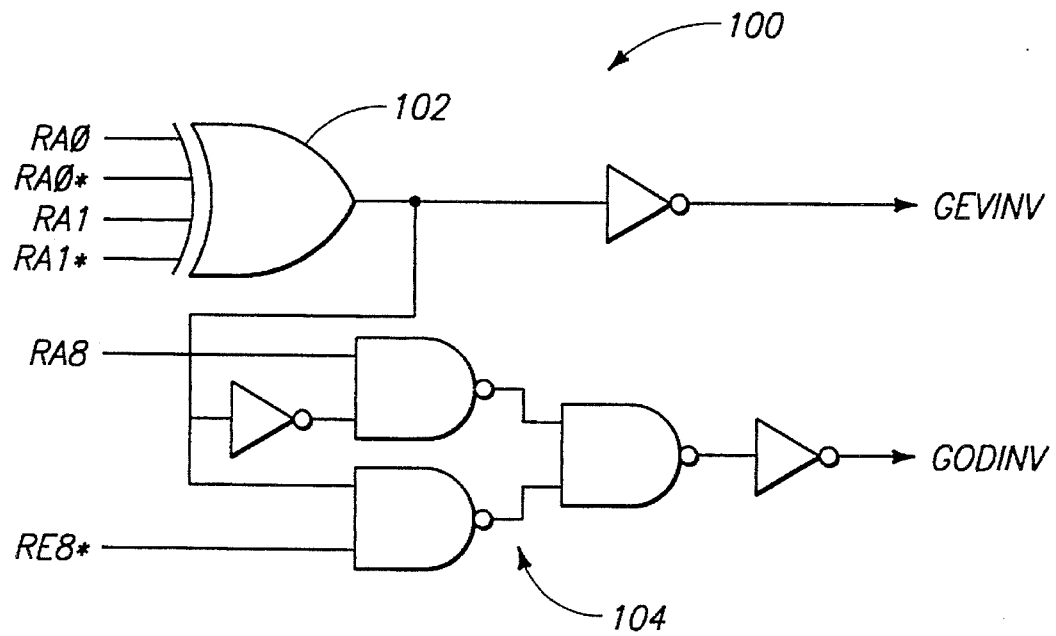
FIG. 6 is a schematic of a global decoding circuit used in the topology logic driver of FIG. 2 to identify certain regions in the memory array for data inversion.
Figure 7:
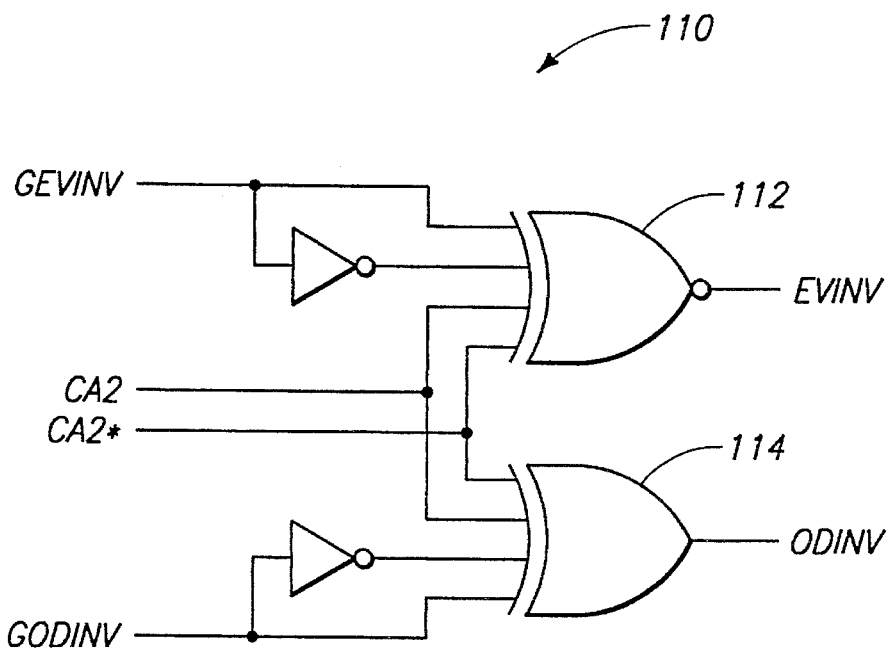
FIG. 7 is a schematic of a regional decoding circuit used in the topology logic driver of FIG. 2 to actuate the selected regions for data inversion.

FIGS. 6 and 7 show circuits that embody these boolean functions for generating the inversion signals EVINV and ODINV based up the row and column addresses. The circuits are part of the topology logic driver 50 for the 64 Meg DRAM example being described herein. The topology logic driver includes a global topology decoding circuit 100 (FIG. 6) and multiple regional topology decoding circuits 110 (FIG. 7) coupled to the global decoding circuit.

The global topology decoding circuit 100 of FIG. 6 is preferably positioned at the center of the memory array. It identifies regions of memory cells in the memory array for possible data inversion based upon a function of the row address signals RA0, RA0*, RA1, RA1*, RA8, and RA8*. Global topology decoding circuit 100 has an eXclusive OR (XOR) gate 102 coupled to receive the two least significant bits RA0, RA1, and their complements. These row address bits are used to select specific row lines. The output of the XOR function is inverted to yield the global even bit inversion signal GEVINV. A combination of AND gates 104 couple the result of the XOR function to row address bits RA8 and RA8*. These row address bits are used to select memory cells on either side of the twist junctions 76. The results of this logic is the global odd bit inversion signal GODINV.

Multiple regional topology decoding circuits, such as circuit 110 in FIG. 7, are provided throughout the array to identify a specific region of memory cells for possible data inversion. Each regional topology decoding circuit 110 comprises two XOR gates 112 and 114 which perform an XOR function of the global invert signals GEVINV and GODINV and the column address signals CA2 and CA2*. The column address signals CA2 and CA2* are used to select a certain set of bit line pairs D0/D0*-D3/D3*. Regional circuit 110 outputs the inversion signals EVINV and ODINV used in the regional array blocks.

FIG. 8 shows an even bit inversion I/O circuit 120 which interfaces the EVINV/EVINV* signals with the internal even bit line pairs (i.e., D0/D0* and D2/D2*) in the memory array. Inversion I/O circuit 120 is shown coupled to bit line pair D0/D0* for purposes of explanation. It operatively inverts data being written to or read from the bit line pair D0/D0*. The construction of an odd bit inversion I/O circuit that is interfaces the ODINV/ODINV* signals with the internal odd bit line pairs (i.e., D1/D1* and D3/D3*) is identical, and thus only circuit 120 will be described in detail. The inversion I/O circuits 120 are part of the topology logic driver 50.

Even bit inversion I/D circuit 120 has an XOR gate 124 which receives the EVINV and EVINV* signals output from regional topology decoding circuit 110. I/O circuit 120 also includes a cross over transistor arrangement or data invertor 126 and a write driver 128. I/O circuit 120 is coupled to DC sense amplifier 122. Data is transferred to or from bit line pair D0/D0* via data read lines DR/DR* and DC sense amplifier 122. The data read lines DR/DR* are connected to the data I/D buffers 34 (FIG. 2). Data is written or read depending upon the data write control signal DW which is input to XOR gate 124. The output of XOR gate 124 controls write driver 128.

The EVINV/EVINV* signals are coupled to the cross over transistor arrangement or data invertor 126. If the data is to be inverted, the EVINV* signal is high and the EVINV signal is low. This causes the data invertor 126 to flip the data being written into or read from the data lines D0/D0*. Conversely, if the data is not inverted, the EVINV* signal is low and the EVINV signal is high. This causes the data invertor 126 to keep the data the same, without inverting it.

The on-chip topology logic driver, which includes global topology circuit 100 (FIG. 6), regional topology circuit 110 (FIG. 7), and inversion I/O circuit 120 (FIG. 8), effectively inverts data to certain memory cells depending upon a function of the row and column addresses. In the above example, the logic driver operated based on a function of row bits RA0, RA0*, RA1, RA1*, RA8, RA8* and column bits CA2, CA2*. By using the address bits, the logic driver can account for any circuit topology, including twisted bit line structures. In this manner, the topology logic driver defines a data inversion means for selectively inverting the data being written to and read from the addressed memory cells based upon location of the addressed memory cells in the circuit topology of the memory array, although other means can be embodied.

The above description is tailored to a specific preferred embodiment of a 64 Meg DRAM. However, the invention can be used for any circuit topology, and is not limited to the structure shown and described. For example, the topology might employ a twisted row line structure, or complex memory block mirroring concepts, or more involved twisted bit line architectures. Accordingly, another aspect of this invention concerns a method for producing a memory integrated circuit chip having an on-chip topology logic driver. The method includes first designing the integrated circuit chip of a predefined circuit topology. Next, a boolean function representing the circuit topology of the integrated circuit is derived. Thereafter, a topology logic circuit embodying the boolean function is formed on the integrated circuit chip.

The memory IC of this invention is advantageous over prior art memory ICs in that it has a built-in, on-chip topology circuit. The on-chip topology logic driver selectively inverts the data being written to and read from the addressed memory cells based upon the location of the addressed memory cells in the circuit topology of the memory array. The use of this predefined topology circuit alleviates the need for manufacturers and user trouble shooters to preprogram testing machines with the boolean function for the specific memory IC. Each memory IC instead has its own internal address decoder which accounts for circuit topologies of any complexity. The testing machine need only write the data test patterns to the memory array without concern for whether the data ought to be inverted for topology reasons.

Another benefit of the novel on-chip topology decoding circuit is that it facilitates testing of the memory array. The on-chip topology circuit is particularly useful in a testing compression mode where many test bits are written and read simultaneously to memory cells in the array. Therefore, another aspect of this invention concerns a method for testing a memory integrated circuit chip having a predefined circuit topology and an on-chip topology decoding circuit. This method will be described with reference to the specific embodiment of a 64 Meg DRAM shown in FIGS. 4–8.

FIG. 9 illustrates the testing method of this invention. The first step 200 is to access groups of memory cells in the memory array. One possible group of memory cells is memory array block 52 in FIG. 4. Next, a selected number of bits of test data are simultaneously written to the accessed groups of memory cells according to a test pattern (step 202). Example test patterns include all binary "1"s, all binary "0s", a checkerboard pattern of alternating "1"s and "0"s, or other possible combinations of "1"s and "0"s.

The on-chip topology logic driver can accommodate a large number of simultaneously written data bits. For instance, a 128x compression (i.e., writing 128 bits simultaneously) or greater can be achieved using the circuitry of this invention. This testing performance exceeds the capabilities of testing machines. Since four secondary amplifiers are coupled to one data line, the testing machines can only write the same data to all four write drivers in secondary amplifiers 80 and 82. However, from the table in FIG. 5, it is shown that D0 and D2 may have to be in an opposite state than D1 and D3 to actually write the same data to the memory cells. Thus, data on two of the four I/O lines may have to be inverted. There is no way for an external testing machine to handle this condition. An on-chip topology circuit of this invention, however, is capable of handling this situation, and moreover can readily accommodate the maximum test address compression of selecting all read/write drivers simultaneously.

The next step 204 is to internally locate certain memory cells within the accessed groups that should receive inverted data to achieve the test pattern given the circuit topology of the memory array. In the above example table of FIG. 5, data applied to upper bit lines D0 and D2 in row R512 (where CA2=0) should be inverted to ensure that the test pattern of all "1"s is actually written to the memory cell. At step 206, the bits of test data being written to the certain memory cells are selectively inverted on-chip based upon their location in the circuit topology. The remaining bits of test data being written to the other memory cells (such as upper bit lines D1 and D3 in row R512) are not inverted.

Subsequent to the writing and inverting steps, test data is then read from the accessed groups of memory cells (step 208). The bits of test data that were previously inverted and written to the certain identified memory cells are again selectively inverted on-chip to return them to their desired state (step 210). Thereafter, at step 212, the bits of test data read from the accessed groups of memory cells are compared with the bits of test data written to the accessed groups of memory cells to determine whether the memory integrated circuit has defective memory cells.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

We claim:

1. A memory integrated circuit chip, comprising:

a memory array of a predefined circuit topology, the memory array having a plurality of memory cells and multiple access lines coupled to associated memory cells;

an address decoder to provide an address for selectively accessing one or more memory cells in the memory array;

I/O buffers to temporarily hold data written to and read from the memory cells in the memory array;

a read/write controller to manage data write and data read operations which transfer data between the I/O buffers and the addressed memory cells; and a topology logic driver to selectively invert the data being written to and read from the addressed memory cells, the topology logic driver selectively inverting the data for certain addressed memory cells and not inverting the data for other addressed memory cells based upon location of the addressed memory cells in the circuit topology of the memory array.

2. A memory integrated circuit chip according to claim 1 wherein the topology logic driver includes a combination of logic gates that embody a boolean function of selected bits in the address, the boolean function defining the circuit topology of the memory array.

3. A memory integrated circuit chip according to claim 1 wherein:

the access lines include row lines and bit lines, the bit lines being arranged in pairs;

the address decoder provides an address which includes a row address for choosing a row line and a column address for choosing a bit line pair; and the topology logic driver selectively inverts the data being written to and read from the addressed memory cells in accordance with a function of the row address.

4. A memory integrated circuit chip according to claim 1 wherein:

the access lines include row lines and bit lines, the bit lines being arranged in pairs;

the address decoder provides an address which includes a row address for choosing a row line and a column address for choosing a bit line pair; and the topology logic driver selectively inverts the data being written to and read from the addressed memory cells in accordance with a function of both the row address and the column address.

5. A memory integrated circuit chip comprising:

a memory array of a predefined circuit topology, the memory array having a plurality of memory cells and multiple access lines coupled to associated memory cells;

an address decoder to provide an address for selectively accessing one or more memory cells in the memory array;

I/O buffers to temporarily hold data written to and read from the memory cells in the memory array;

a read/write controller to manage data write and data read operations which transfer data between the I/0 buffers and the addressed memory cells; and a topology logic driver to selectively invert the data being written to and read from the addressed memory cells, the topology logic driver selectively inverting the data for certain addressed memory cells and not inverting the data for other addressed memory cells based upon location of the addressed memory cells in the circuit topology of the memory array, the topology logic driver including a global decoding circuit which identifies regions of memory cells in the memory array for possible data inversion, and the topology logic driver including multiple regional decoding circuits which identify a specific region of memory cells in the memory array for possible data inversion.

6. A memory integrated circuit chip comprising:

a memory array of a predefined circuit topology, the memory array having a plurality of memory cells and multiple access lines coupled to associated memory cells, the access lines including row lines and bit lines, the bit lines being arranged in pairs;

an address decoder to provide an address for selectively accessing one or more memory cells in the memory array, the address decoder providing an address which includes a row address for choosing a row line and a column address for choosing a bit line pair;

I/O buffers to temporarily hold data written to and read from the memory cells in the memory array;

a read/write controller to manage data write and data read operations which transfer data between the I/O buffers and the addressed memory cells; and a topology logic driver to selectively invert the data being written to and read from the addressed memory cells, the topology logic driver selectively inverting the data for certain addressed memory cells and not inverting the data for other addressed memory cells based upon location of the addressed memory cells in the circuit topology of the memory array, the topology logic driver including a global decoding circuit which identifies regions of memory cells in the memory array for possible data inversion based upon a function of the row address, the global decoding circuit outputting a global invert signal, and the topology logic driver including multiple regional decoding circuits which identify a specific region of memory cells in the memory array for possible data inversion based upon a function of the global invert signal and the column address.

7. A memory integrated circuit chip, comprising:

a memory array having a plurality of memory cells and multiple row and column lines coupled to associated memory cells, the bit lines being arranged in pairs and having a twisted line structure where bit lines in the bit line pairs cross other bit lines in the bit line pairs at twist junctions in the memory array;

an address decoder to provide an address for selectively accessing one or more memory cells in the memory array, the address including a row address for choosing a row line and a column address for choosing a bit line pair;

I/O buffers to temporarily hold data written to and read from the memory cells in the memory array;

a read/write controller to manage data write and data read operations which transfer data between the I/O buffers and the addressed memory cells; and a topology logic driver to selectively invert the data being written to and read from the addressed memory cells, the topology logic driver selectively inverting the data for certain addressed memory cells and not inverting the data for other addressed memory cells based upon location of the addressed memory cells in the memory array in relation to their associated bit line pairs and twist junctions.

8. A memory integrated circuit chip according to claim 7 wherein the topology logic driver includes a combination of logic gates that embody a boolean function of selected bits in the address, the boolean function defining the circuit topology of the memory array.

9. A memory integrated circuit chip according to claim 7 wherein the topology logic driver selectively inverts the data being written to and read from the addressed memory cells in accordance with a function of the row address.

10. A memory integrated circuit chip according to claim 7 wherein the topology logic driver selectively inverts the data being written to and read from the addressed memory cells in accordance with a function of both the row address and the column address.

11. A memory integrated circuit chip according to claim 7 wherein the topology logic driver includes:

a global decoding circuit which identifies regions of memory cells in the memory array for possible data inversion; and multiple regional decoding circuits which identify a specific region of memory cells in the memory array for possible data inversion.

12. A memory integrated circuit chip according to claim 7 wherein the topology logic driver includes:

a global decoding circuit which identifies regions of memory cells in the memory array for possible data inversion based upon a function of the row address, the global decoding circuit outputting a global invert signal; and multiple regional decoding circuits which identify a specific region of memory cells in the memory array for possible data inversion based upon a function of the global invert signal and the column address.

13. A memory integrated circuit chip, comprising:

a memory array of a predefined circuit topology, the memory array having a plurality of bit line pairs arranged in a folded bit line construction and a plurality of row lines, the bit line pairs having a twisted bit line structure where bit lines in the bit line pairs cross other bit lines in the bit line pairs at twist junctions in the memory array, the memory array having multiple memory cells coupled at intersections of the bit line pairs and the row lines;

an address decoder to provide addresses for choosing row lines and bit line pairs to selectively access the memory cells in the memory array, the addresses consisting of multiple bits;

data I/O means for reading and writing data to chosen bit line pairs;

data inversion means for selectively inverting the data being written to and read from the addressed memory cells based upon location of the addressed memory cells in the circuit topology of the memory array; and the memory integrated circuit chip being operable in a test mode to write data of the same binary value to all memory cells coupled to the chosen bit line pairs in the memory array, the data inversion means selectively inverting the data input to certain memory cells coupled to the chosen bit line pairs and not inverting the data input to other memory cells coupled to the chosen bit line pairs to account for the circuit topology.

14. A memory integrated circuit chip according to claim 13 wherein:

the data contains alternating even and odd bits;

the data inversion means generates two sets of complementary signals EVINV/EVINV* and ODINV/DDINV*, the complementary EVINV/EVINV* signals being used to selectively invert the even bits of data and the complementary ODINV/DDINV* signals being used to selectively invert the odd bits of data; and the circuit topology of the memory array is such that, following any conversion by the data inversion means, all of the even bits of data actually input to the addressed memory cells coupled to the same row line are identical and the odd bits of data actually input to the addressed memory cells coupled to the same row line are identical.

15. A method for producing a memory integrated circuit chip having an on-chip topology logic driver, the method comprising the following steps:

providing an integrated circuit chip having a predefined circuit topology, the integrated circuit chip comprising a memory array having a plurality of memory cells and multiple access lines coupled to associated memory cells;

deriving a boolean function representing the circuit topology of the integrated circuit; and forming a topology logic circuit embodying the boolean function on the integrated circuit chip.

16. A method of testing a memory integrated circuit chip having a predefined circuit topology; the memory integrated circuit chip comprising a memory array having a plurality of memory cells and multiple access lines coupled to associated memory cells, the memory cells consisting of both normal and redundant memory cells; the method comprising the following steps:

accessing groups of memory cells in the memory array according to addresses for the memory cells;

simultaneously writing a selected number of bits of test data to the accessed groups of memory cells according to a test pattern;

internally locating certain memory cells within the accessed groups that should receive inverted data to achieve the test pattern for the given circuit topology of the memory array;

selectively inverting on-chip the bits of test data being written to the certain memory cells based upon their location in the circuit topology while not inverting the bits of test data being written to other memory cells;

reading the test data from groups of memory cells;

selectively inverting on-chip the bits of test data read from the certain memory cells that had been previously inverted; and comparing the bits of test data written to the accessed groups of memory cells with the bits of test data read from the accessed groups of memory cells to determine whether the memory integrated circuit has defective memory cells.

* * * * *